(12) United States Patent
Srinivasan et al.

(10) Patent No.: US 9,099,183 B2
(45) Date of Patent: Aug. 4, 2015

(54) PROGRAM VT SPREAD FOLDING FOR NAND FLASH MEMORY PROGRAMMING

(71) Applicant: Intel Corporation, Santa Clara, CA (US)

(72) Inventors: Charan Srinivasan, Redwood City, CA (US); Pranav Kalavade, San Jose, CA (US); Shyam Sunder Raghunathan, Sunnyvale, CA (US); Krishna K. Parat, Palo Alto, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/139,219

(22) Filed: Dec. 23, 2013

(65) Prior Publication Data

US 2015/0179267 A1     Jun. 25, 2015

(51) Int. Cl.
| | |
|---|---|
| *G11C 11/34* | (2006.01) |
| *G11C 16/10* | (2006.01) |
| *G11C 16/28* | (2006.01) |
| *G11C 11/56* | (2006.01) |
| *G11C 16/34* | (2006.01) |
| *G11C 16/08* | (2006.01) |

(52) U.S. Cl.
CPC .......... *G11C 16/107* (2013.01); *G11C 11/5628* (2013.01); *G11C 11/5642* (2013.01); *G11C 16/28* (2013.01); *G11C 16/08* (2013.01); *G11C 16/3454* (2013.01)

(58) Field of Classification Search
CPC .......... G11C 11/5628; G11C 11/5642; G11C 16/08; G11C 16/10; G11C 16/0425; G11C 16/0483; G11C 16/30; G11C 16/28; H01L 27/115
USPC ............. 365/185.03, 185.11, 185.12, 185.14, 365/185.17, 185.18, 185.19, 185.2, 185.22, 365/185.23, 185.24
See application file for complete search history.

(56) References Cited

U.S. PATENT DOCUMENTS 7,764,542 B2 *    7/2010    Edahiro et al. ........... 365/185.03

* cited by examiner

*Primary Examiner* — Fernando Hidalgo
(74) *Attorney, Agent, or Firm* — Alpine Technology Law Group LLC

(57) ABSTRACT

Embodiments of methods and systems disclosed herein provide a NAND cell programming technique that results in a substantially reduced $T_{prog}$ to complete a programming operation. In particular, embodiments of the subject matter disclosed herein utilize two $V_{pgm}$ programming pulses during each programming iteration, or loop. One of the two programming pulses corresponds to a conventional programming $V_{pgm}$ pulse and the second pulse comprises a programming pulse that having a greater $V_{pgm}$ that is greater than the conventional programming $V_{pgm}$ so that the slow cells are programmed to PV in fewer pulses (iterations), thereby effectively simultaneously programming and verifying cells having different programming speeds.

21 Claims, 8 Drawing Sheets

PROGRAM VT SPREAD FOLDING FOR NAND FLASH MEMORY PROGRAMMING

TECHNICAL FIELD

Embodiments of systems and techniques described herein relate to memory devices. More particularly, embodiments of systems and techniques described herein relate to methods and systems for programming NAND devices with a reduced time to complete a programming operation (i.e., a reduced $T_{prog}$).

BACKGROUND

In NAND technology, programming is performed in parallel simultaneously on all cells along a word line (WL) that are to be programmed. The time taken to complete a programming operation is referred to as $T_{prog}$, and is an important figure of merit for a NAND device. As NAND devices scale smaller, the effects of parasitic coupling capacitance continue to increase and cause a longer time to charge word lines to high voltages.

Due to several sources of variation, such as doping concentration, tunneling, structural, etc., there is usually a significant variation in the programming speeds of the different cells along a word line. The variation in programming speeds is a metric referred to as the Program $V_t$ Sigma (PVS). A goal of a NAND programming technique is to obtain the tightest possible threshold voltage ($V_t$) distribution of NAND cells above a program verify (PV) $V_t$ level for a given $T_{prog}$ budget. In a conventionally used programming technique, the programming voltage ($V_{pgm}$) for the first programming pulse ($V_{pgm\_min}$) of a programming operation is selected so that the fastest-to-program cells ("fast cells") do not over-program. The final $V_{pgm}$ ($V_{pgm\_max}$) is determined by the slowest-to-program cells ("slow cells"), which need to be programmed up to the verify voltage. During the programming operation, $V_{pgm}$ is stepped in increments (Gate_Step) from $V_{pgm\_min}$ to $V_{pgm\_max}$ to obtain the tightest possible threshold voltage ($V_t$) distribution above a program verify (PV) $V_t$ voltage for a given $T_{prog}$ budget.

BRIEF DESCRIPTION OF THE DRAWINGS

Embodiments disclosed herein are illustrated by way of example, and not by way of limitation, in the figures of the accompanying drawings in which like reference numerals refer to similar elements and in which.

Figure 1:
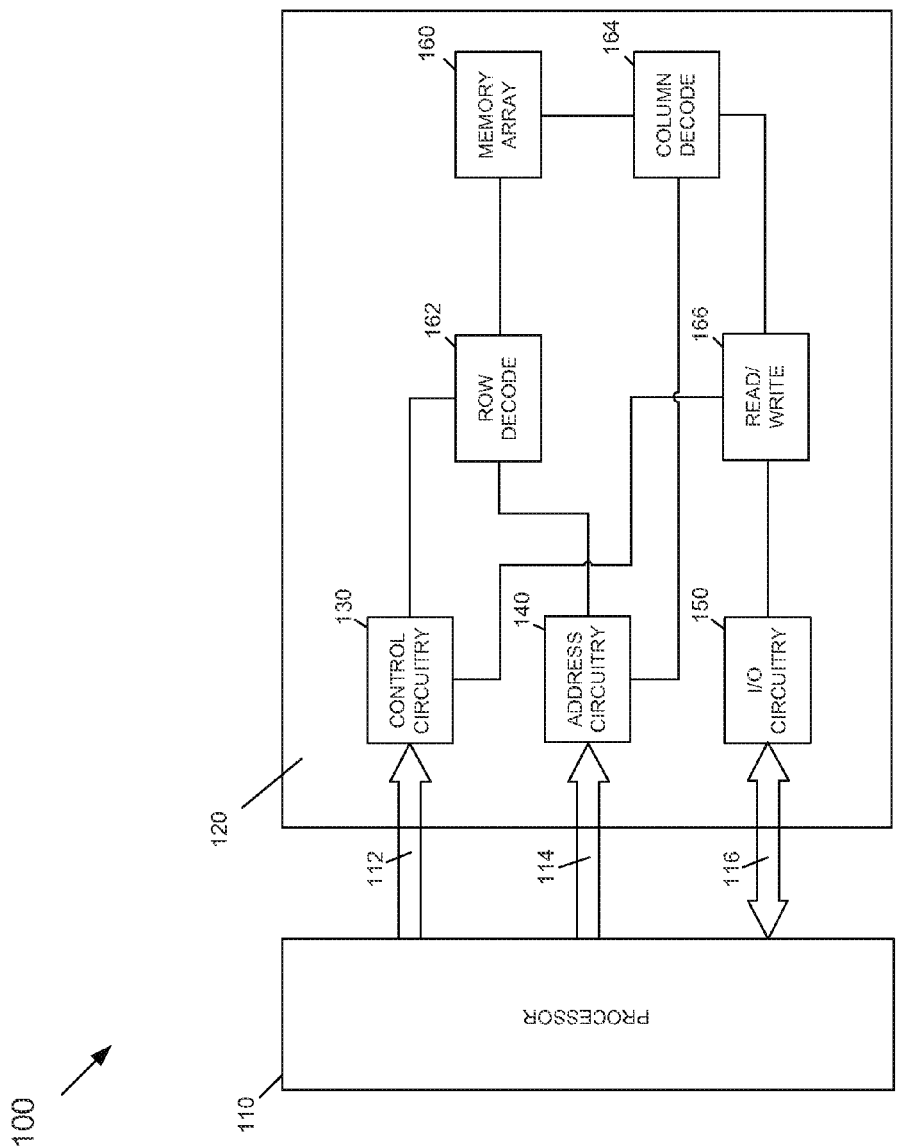
FIG. 1 depicts a block diagram of an exemplary system for programming NAND cells using the techniques disclosed herein.

It will be appreciated that for simplicity and/or clarity of illustration, elements depicted in the figures have not necessarily been drawn to scale. For example, the dimensions of some of the elements may be exaggerated relative to other elements for clarity. The scaling of the figures does not represent precise dimensions and/or dimensional ratios of the various elements depicted herein. Further, if considered appropriate, reference numerals have been repeated among the figures to indicate corresponding and/or analogous elements.

DESCRIPTION OF THE EMBODIMENTS

Embodiments of techniques described herein relate to methods and systems for programming NAND devices with a reduced time to complete a programming operation ($T_{prog}$). In the following description, numerous specific details are set forth to provide a thorough understanding of embodiments disclosed herein. One skilled in the relevant art will recognize, however, that the embodiments disclosed herein can be practiced without one or more of the specific details, or with other methods, components, materials, and so forth. In other instances, well-known structures, materials, or operations are not shown or described in detail to avoid obscuring aspects of the specification.

Reference throughout this specification to "one embodiment" or "an embodiment" means that a particular feature, structure or characteristic described in connection with the embodiment is included in at least one embodiment. Thus, appearances of the phrases "in one embodiment" or "in an embodiment" in various places throughout this specification are not necessarily all referring to the same embodiment. Furthermore, the particular features, structures or characteristics may be combined in any suitable manner in one or more embodiments. Additionally, the word "exemplary" is used herein to mean "serving as an example, instance, or illustration." Any embodiment described herein as "exemplary" is not to be construed as necessarily preferred or advantageous over other embodiments.

Various operations may be described as multiple discrete operations in turn and in a manner that is most helpful in understanding the claimed subject matter. The order of description, however, should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

Embodiments of the subject matter disclosed herein provide a programming technique that provides a substantial reduction in $T_{prog}$. In particular, embodiments of the subject matter disclosed herein utilize two $V_{pgm}$ programming pulses during each programming iteration, or loop. According to the subject matter disclosed herein, one of the two programming pulses corresponds to a conventional programming $V_{pgm}$ pulse and the second pulse comprises a programming pulse having a $V_{pgm}$ that is greater than the conventional programming $V_{pgm}$ so that the slow cells are programmed to PV in fewer pulses (iterations), thereby effectively simultaneously programming and verifying cells having different programming speeds and providing a substantial reduction in $T_{prog}$.

FIG. 1 depicts a block diagram of an exemplary system 100 for programming NAND cells using the techniques disclosed herein. System 100 may include one or more memory devices 120 that may be coupled to a processor 110. The one or more memory devices 120 may comprise a nonvolatile memory device, such as a NAND memory array 160 that is capable of being programmed according to the technique depicted in FIG. 3. Processor 110 may comprise a microprocessor, a controller, or other controlling circuitry. Memory device 120 and processor 110 may form at least a part of an electronic system 100, such as a laptop or desktop computer, a cell phone, a personal digital assistant (PDA), a camera, or other similar devices. System 100 and memory device 120 may have any number of additional components not depicted in FIG. 1. Accordingly, FIG. 1 has been simplified to specifically focus on features of the memory device 120.

An address buffer circuitry 140 may be provided to latch address signals provided on address input connections 114. The address signals may be received and decoded in a well-known manner by a row decoder 162 and a column decoder 164 to access memory array 160. The number of address input connections may depend on the density and architecture of memory array 160 and, for example, may increase with an increased number of memory cells in memory array 160.

Memory device 120 may read data in the memory array 160 by sensing voltage or to current changes in the memory array columns using read/write circuitry 166. A data input and output (I/O) buffer circuitry 150 may perform bi-directional data communication over a plurality of data connections 116 with processor 110. Read/write circuitry 166 may also facilitate writing data to memory array 160 using the techniques disclosed herein.

Control circuitry 130 may decode signals provided on control connections 112 by processor 110. These signals may be used to control the operations on memory array 160, including data read, data write (data program), and erase operations. In the various embodiments, control circuitry 130 may execute any one or more of techniques or portions of the techniques described herein. Control circuitry 130 may comprise a state machine, a sequencer, or other suitable controller circuitry. System 100 may comprise any number of devices, as noted previously, including a single memory storage device, such as a flash memory, including a NAND-type or NOR-type flash memory.

In one exemplary embodiment, read/write circuitry 166 under control of control circuitry 130 applies a first programming pulse to the gates of a plurality of NAND cells of a word line that are to be programmed within NAND memory array 160. Control circuitry 130 then determines a programmed threshold voltage ($V_t$) of each of the plurality of NAND cells in response to the first programming pulse, and categorizes a NAND cell as a fast cell if the determined $V_t$ of the NAND cell is greater a first predetermined voltage, otherwise categorizing the NAND cell as a slow cell. Read/write circuitry 166 under control of control circuitry 130 the applies a second programming pulse to the gates of the slow-cell NAND cells if a slow cell NAND cell has a determined $V_t$ that is less than a program verify (PV) voltage, and applies a third programming pulse to the gates of the slow-cell and fast-cell NAND cells if a NAND cell has a determined $V_t$ that is less that the PV voltage, the third programming pulse having a programming voltage that is less than the programming voltage of the second programming pulse. Read/write circuitry 166 under control of control circuitry 130 repeats the applying of the second and third programming pulses to the gates of the NAND cells until all of the NAND cells have a $V_t$ that is greater than the PV voltage.

Figure 2A:
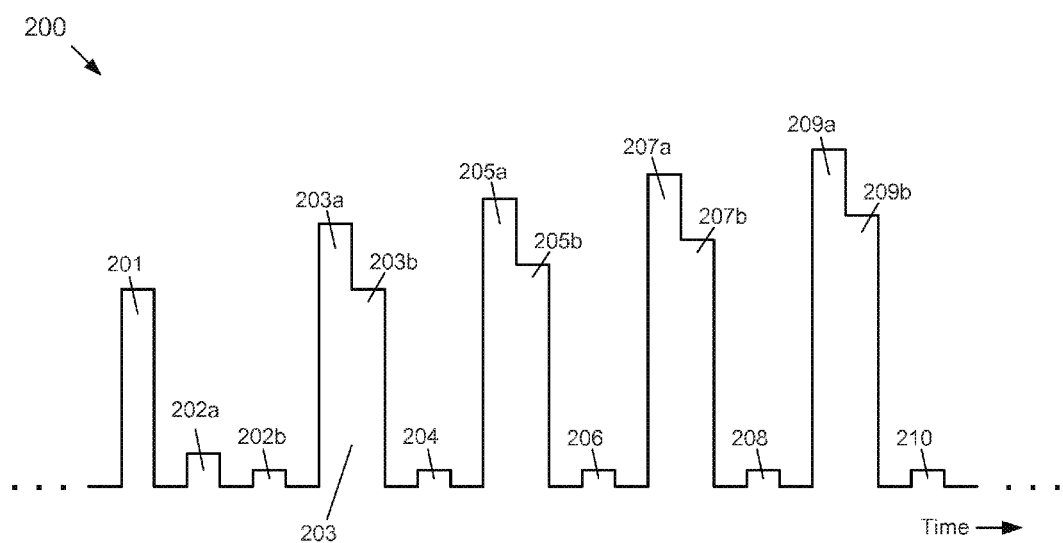
FIG. 2A depicts an exemplary sequence of programming pulses $V_{pgm}$ according to the subject matter disclosed herein.
Figure 2B:
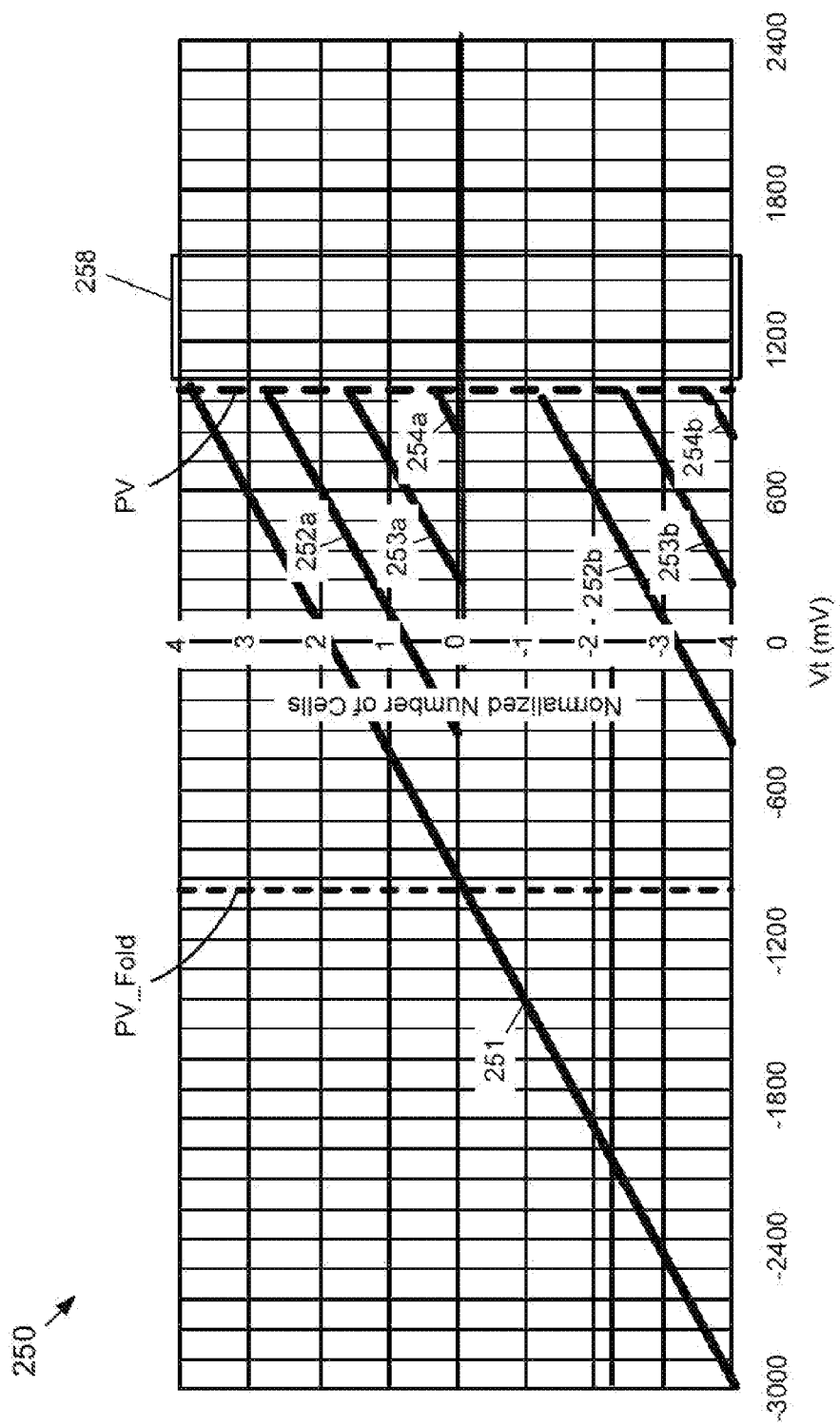
FIG. 2B depicts a graph of a normalized distribution of cells along a word line as a function of threshold voltage Vt and of programming pulses according to the subject matter disclosed herein.

FIG. 2A depicts an exemplary sequence 200 of programming pulses $V_{pgm}$ according to the subject matter disclosed herein. The pulses depicted in sequence 200 are representative of a NAND programming process according to the subject matter disclosed herein. FIG. 2B depicts a graph 250 of a normalized distribution of cells along a word line as a function of threshold voltage $V_t$ and of programming pulses according to the subject matter disclosed herein.

In FIG. 2A, a first programming pulse 201 is initially applied to the gates of the cells along a word line (not shown) that are to be programmed. The voltage level of pulse 201 is selected to be a low $V_{pgm}$ so that the fast cells do not over-program. After first pulse 201, a special verify pulse 202a is applied to all of the gates of the cells along the word line that are to be programmed. Special verify pulse 202a is depicted in FIG. 2B by a dotted vertical line at a $V_t=-1000$ mV and indicated as PV_Fold. Special verify pulse 202a is followed a conventional verify pulse 202b. Line 251 in FIG. 2B depicts the normalized distribution of all of the cells along the word line that are to be programmed. The cells are categorized, or bucketed, into a slow-to-program category ("slow cells") and a fast-to-program category ("fast cells") based on their location along line 251 with respect to PV_Fold. That is, the fast cells are located on line 251 and have a $V_t$ greater than or equal to $-1000$ mV, and the slow cells are located on line 251 and have a $V_t$ that is less than $-1000$ mV.

After bucketing, a second pulse 203 is applied to the gates of the NAND cells that do not have a $V_t$ greater than or equal to PV. Second pulse 203 comprises two $V_{pgm}$ pulse parts—a pulse part 203a comprising a $V_{pgm}$ has been selected to target the fastest-to-program cells of the slow cells; and a pulse part 203b comprising a $V_{pgm}$ has been selected to target all of the fast cells and all of the slow cells that do not have a $V_t$ greater than or equal to PV.

The difference between the $V_{pgm}$ of pulse part 203a and the $V_{pgm}$ of pulse part 203b is related to the voltage of PV_Fold. For the example depicted in FIGS. 2A and 2B, PV_Fold is selected to be $-1000$ mV. The difference between PV and PV_Fold is 2000 mV. Consequently, the $V_{pgm}$ of pulse part 203a is selected to be 2000 mV greater than the $V_{pgm}$ of pulse part 203b. More generally, the $V_{pgm}$ of pulse part 203a is selected to be greater than the $V_{pgm}$ of pulse part 203b by about the difference between PV and PV_Fold. If, for example, PV_Fold had been selected to be $-750$ mV, the difference between PV and PV Fold would be 1750 mV, and the $V_{pgm}$ of pulse part 203a is selected to be 1750 mV greater than the $V_{pgm}$ of pulse part 203b.

After verify pulse 204, the normalized distribution of cells that are still to be programmed lie along lines 252a and 252b in FIG. 2B. That is, the remaining fastest programming cells in the fast-cell bucket lie along line 252a toward the PV voltage line, and the rest of the remaining fast cells lie somewhere along line 252a. Similarly, the fastest programming cells in the slow-cell bucket lie along line 252b toward the PV voltage line, and the rest of the remaining slow cells lie somewhere along line 252b.

The programming technique disclosed herein continues with subsequent programming pulses 205a,b-209a,b and corresponding verify pulses 206-210 until the threshold voltage $V_t$ of the slowest cell that is to be programmed is greater than or equal to PV. That is, all cells regardless whether the cell was bucketed as a fast cell or a slow cell have a threshold voltage $V_t$ that is greater than or equal to PV. After each programming pulse and corresponding verify pulse, the normalized distribution of cells that are still to be programmed respectively lie along lines 253a,b-254a,b. All cells are within the threshold voltage $V_t$ distribution goal 258 after all cells have been programmed to have a threshold voltage $V_t$ that is greater than or equal to PV.

Figure 3:
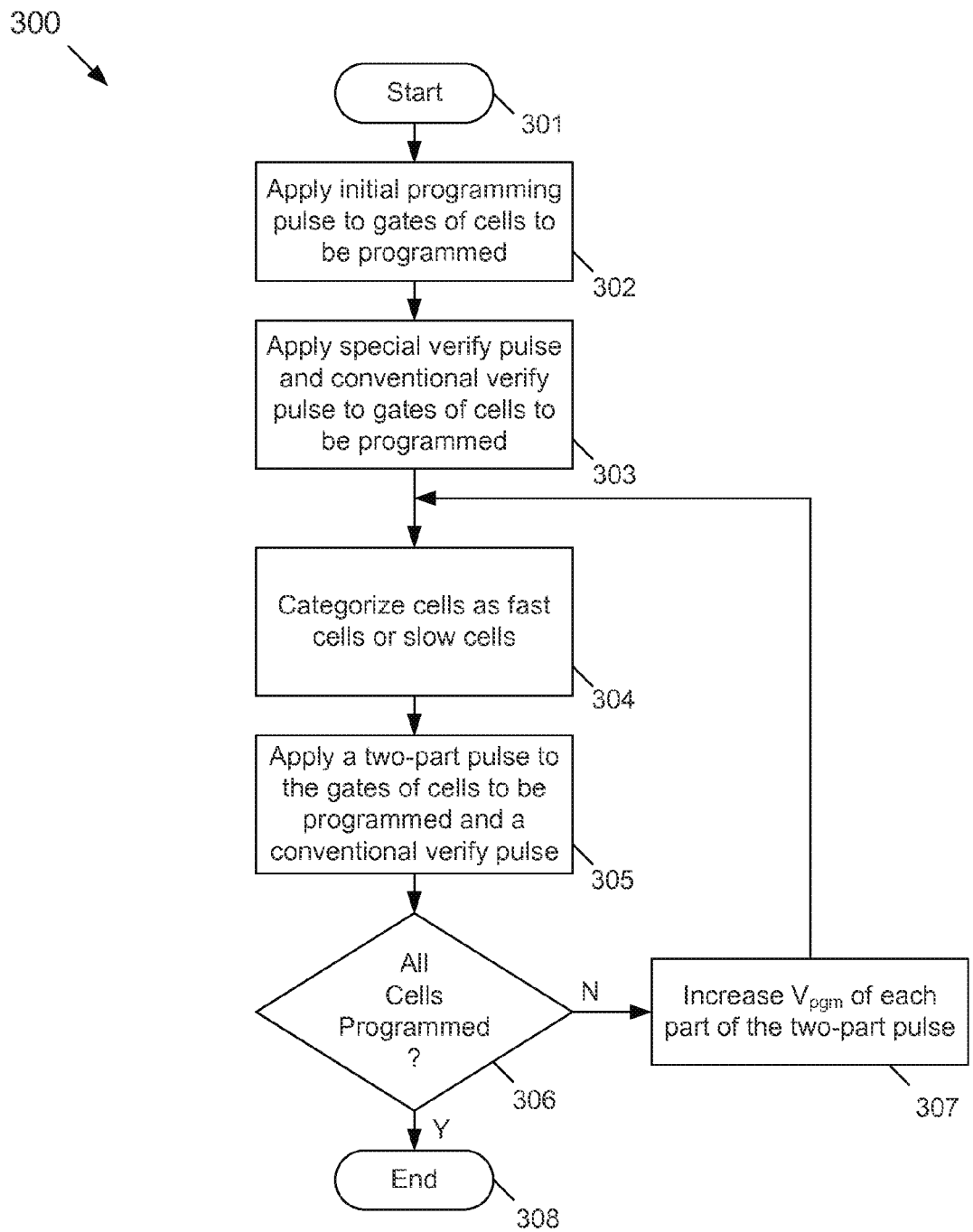
FIG. 3 depicts a flow diagram of an exemplary embodiment of a programming technique according to the subject matter disclosed herein.

FIG. 3 depicts a flow diagram 300 of an exemplary embodiment of a programming technique according to the subject matter disclosed herein. The process begins at block 301 with reference to FIG. 2A. At block 302, an initial pulse 201 is applied to the gates of the cells along a word line (not shown) that are to be programmed. The voltage level of pulse 201 is selected to be a low $V_{pgm}$ so that the fast cells do not over-program. Flow continues to block 303 where a special verify pulse 202a and a conventional verify pulse 202b are applied to the gates of the cells that are to be programmed. The voltage level of special verify pulse 202a is depicted in FIG. 2B by dotted vertical line as PV_fold. Flow continues to block 03 where the cells that are to be programmed are categorized into a fast-cell bucket (or category) and a slow-cell bucket (or category).

Flow continues to block 305, where a second pulse 203 is applied to the gates of the cells that are to be programmed Second pulse 203 comprises two $V_{pgm}$ pulse parts—a pulse part 203a comprising a $V_{pgm}$ has been selected to target the fastest-to-program cells of the slow cells; and a pulse part 203b comprising a $V_{pgm}$ has been selected to target all of the fast cells and all of the slow cells that do not have a $V_t$ greater than or equal to PV. Also at block 305, a conventional verify pulse is applied to the gates of the cells that are to be programmed.

Flow continues to block 306 where it is determined whether all cells that are to be programmed have been programmed. If, at block 306, it is determined that all cells that are to be programmed have not been programmed, flow continues to block 307 where the respective $V_{pgm}$ of each of the two parts of the two-part pulse are increased. Flow continues to block 305 where the programming process continues. If, at block 306, it is determined that all cells that are to be programmed have been programmed, flow continues to block 308 where the process ends.

Exemplary alternative embodiments of the subject matter disclosed herein are only limited by implementation complexity. For example, in one exemplary alternative embodiment, cells can be categorized, or bucketed, into more than two categories (i.e., more than a fast cell bucket and a slow cell bucket). That is, a PVS-distribution can be divided into n buckets and n different $V_{pgms}$ pulses are applied to the different buckets in a manner described above. If, for example, three buckets are used, a triple programming pulse would be used in which all three programming pulses would be applied to the cells in the slowest bucket. The two lowest $V_{pgm}$ programming pulses of the triple programming pulse would be applied to the cells in the middle bucket. The lowest $V_{pgm}$ programming pulse of the triple programming pulse would be applied to the cells in the fastest bucket. The differences between the $V_{pgm}$ of the different pulses of the triple programming pulse are related to the voltage thresholds selected to define each category, or bucket. In one exemplary embodiment, the differences between the Vpgm of the two largest programming pulses and the smallest programming pulse are about the different between the largest voltage threshold defining the category corresponding to the bucket and PV.

Accordingly, exemplary alternative embodiments utilizing more than two buckets will provide a greater reduction in $T_{prog}$ than the exemplary embodiment described in connection with FIGS. 2A and 2B. Moreover, the programming techniques according to the subject matter disclosed herein can also be applied to program multi-level cell distributions such as 2-bits per cell (three programmed distributions and one erased distribution) and 3-bits per cell (seven program distributions and one erased distributions).

Figure 4A:
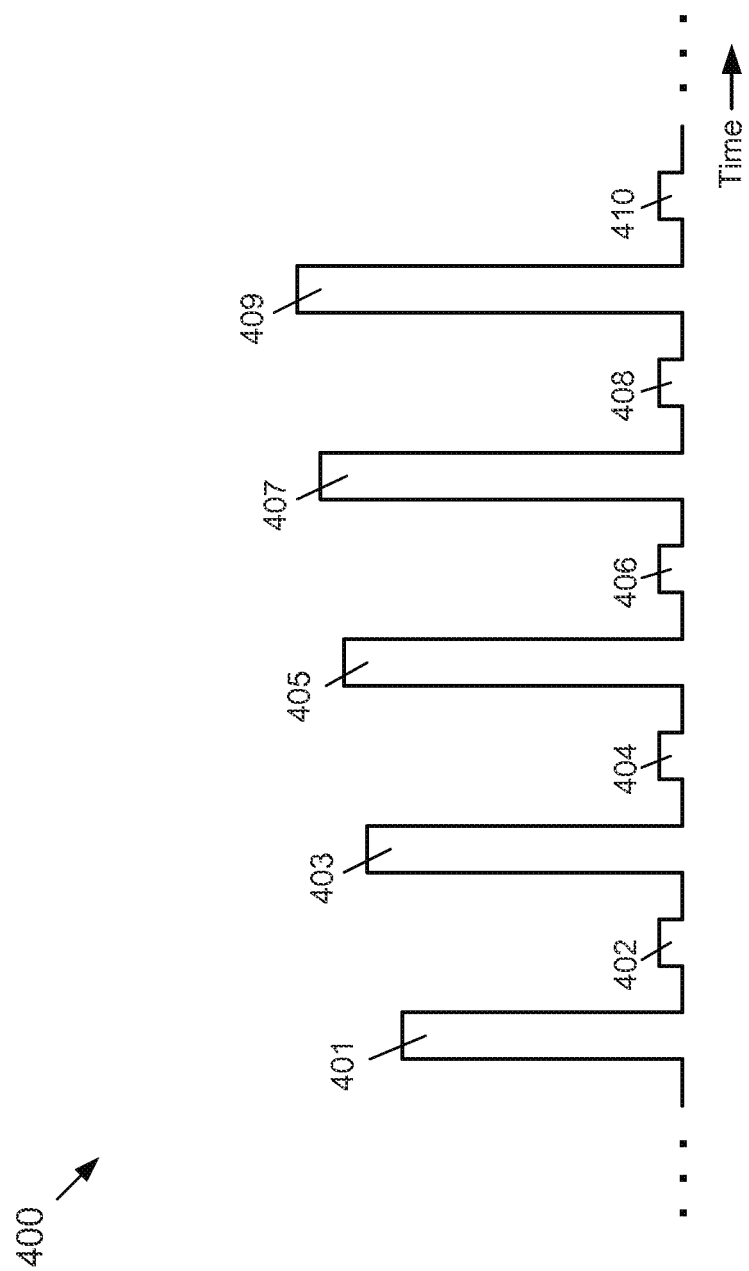
FIG. 4A depicts an exemplary conventional sequence of programming pulses for a conventional NAND programming technique.
Figure 4B:
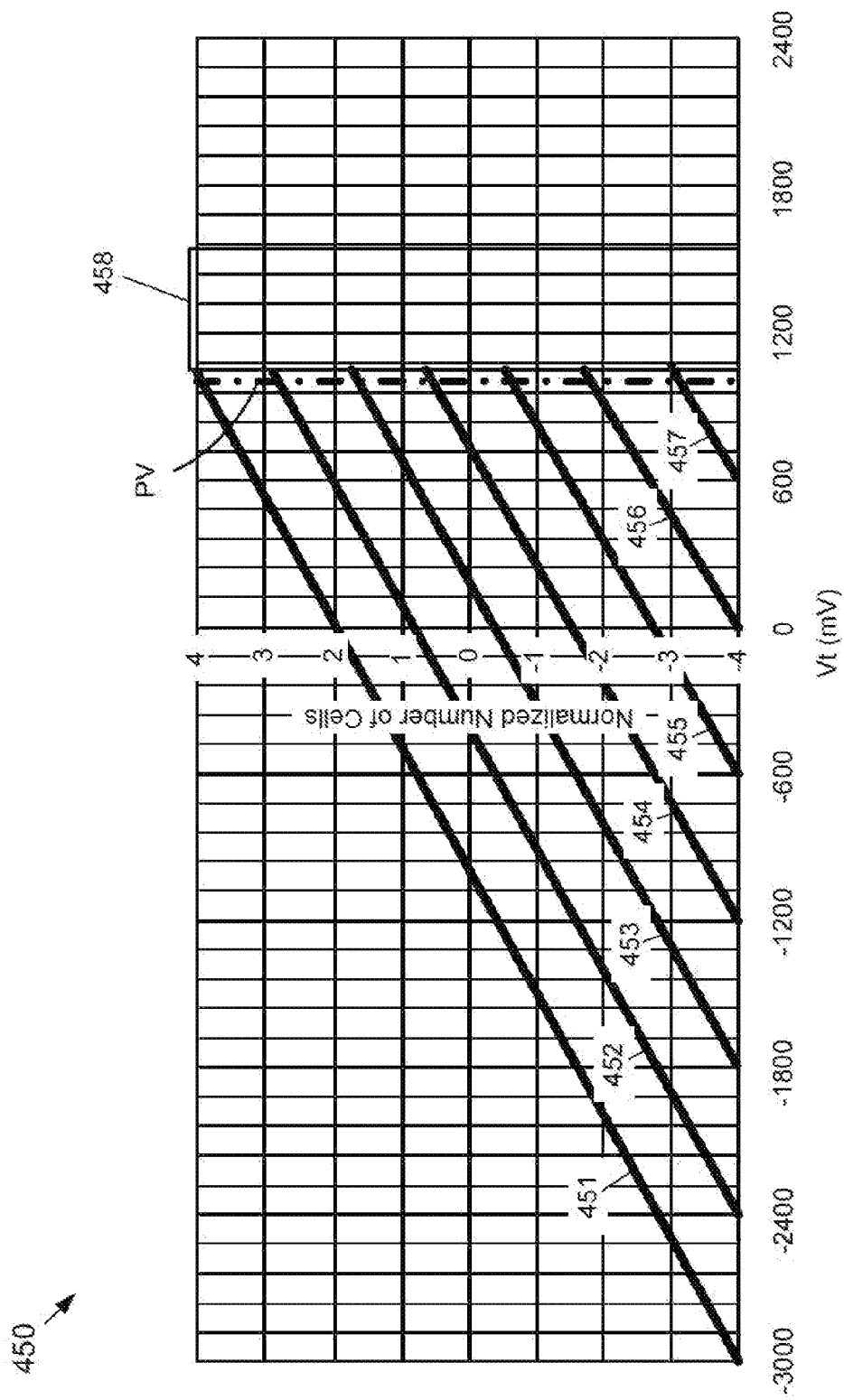
FIG. 4B depicts a graph of a normalized distribution of cells along a word line as a function of threshold voltage Vt and as a function of programming pulses according the conventional NAND programming technique depicted in FIG. 4A.

FIG. 4A depicts an exemplary conventional sequence 400 of programming pulses for a conventional NAND programming technique. The pulses depicted in sequence 400 are representative of the conventional NAND programming process. FIG. 4B depicts a graph 450 of a normalized distribution of cells along a word line as a function of threshold voltage $V_t$ and as a function of programming pulses according the conventional NAND programming technique depicted in FIG. 4A.

In exemplary conventional sequence 400, a programming pulse 401 is initially applied to the gates of the cells along a word line (not shown) that are to be programmed. The voltage level of pulse 401 is selected to be a low $V_{pgm}$ so that the fastest-to-program cells ("fast cells") do not over-program. Initial pulse 401 is followed by a verify pulse 402. After programming pulse 401 and verify pulse 402, the normalized distribution of cells along the word line that are to be programmed lie along line 451 in FIG. 4B. The fast cells are located on line 451 at or toward the end of line 451 that is near $V_t$=+1000 mV for this example, i.e., the Program Verify (PV) voltage line. The slow cells are located on line 451 at or toward the end of line 451 that is near $V_t$=−3000 mV for this example.

For the next programming pulse 403, $V_{pgm}$ is increased and applied only to the gates of the fast and slow cells along the word line that were programmed by initial pulse 401, but have a $V_t$ that is less than to be less than $V_t$=+1000 mV (i.e., PV). The $V_{pgm}$ for the second pulse 403 of the conventional programming technique is selected so that the fast cells that do not yet have a $V_t$ greater than PV do not overprogram. Accordingly, the amount by which $V_{pgm}$ can be increased during the second pulse is limited. After programming pulse 403 and verify pulse 404, the normalized distribution of cells along the word line that are to be programmed lie along to line 452 in FIG. 4B. The remaining fast cells are located on line 452 toward at the PV end of line 452, and the remaining slow cells that did not program to a $V_t$ of PV lie somewhere along line 452.

The conventional programming technique continues with subsequent programming pulses 405-409 and corresponding verify pulses 406-410 until all of the fast cells and slow cells have a $V_t$ greater than or equal to PV. After each programming pulse 405-409 and corresponding verify pulse 406-410, the normalized distribution of cells along the word line that are to be programmed respectively lie along lines 453-457. After all cells have been programmed to have a $V_t$ that is greater than or equal to PV, all of the NAND cells are then within the threshold voltage $V_t$ distribution goal 458.

The technique disclosed herein programs the cells of a word line using fewer pulses (i.e., a shorter $T_{prog}$). This can be seen by comparing FIGS. 2B and 4B. For the exemplary process depicted in FIG. 2B, a total of four programming pulses (double pulses) plus overhead were used. In contrast, for the exemplary process depicted in FIG. 4B, a total of seven programming pulses plus over were used. For the exemplary process depicted in FIGS. 2A and 2B, and for well-chosen PV Fold and $V_{pgm}$ that were intended to program the slow cells, half the programming pulses and verify pulses beyond the first programming pulse (pulses 201 and 401) are saved, or not needed, in comparison to the exemplary programming technique depicted in FIGS. 4A and 4B. Overall, embodiments of the subject matter disclosed herein can provide up to a decrease of about 20% $T_{prog}$ over conventional programming techniques even with additional overhead associated with the special verify pulse 202a.

Figure 5:
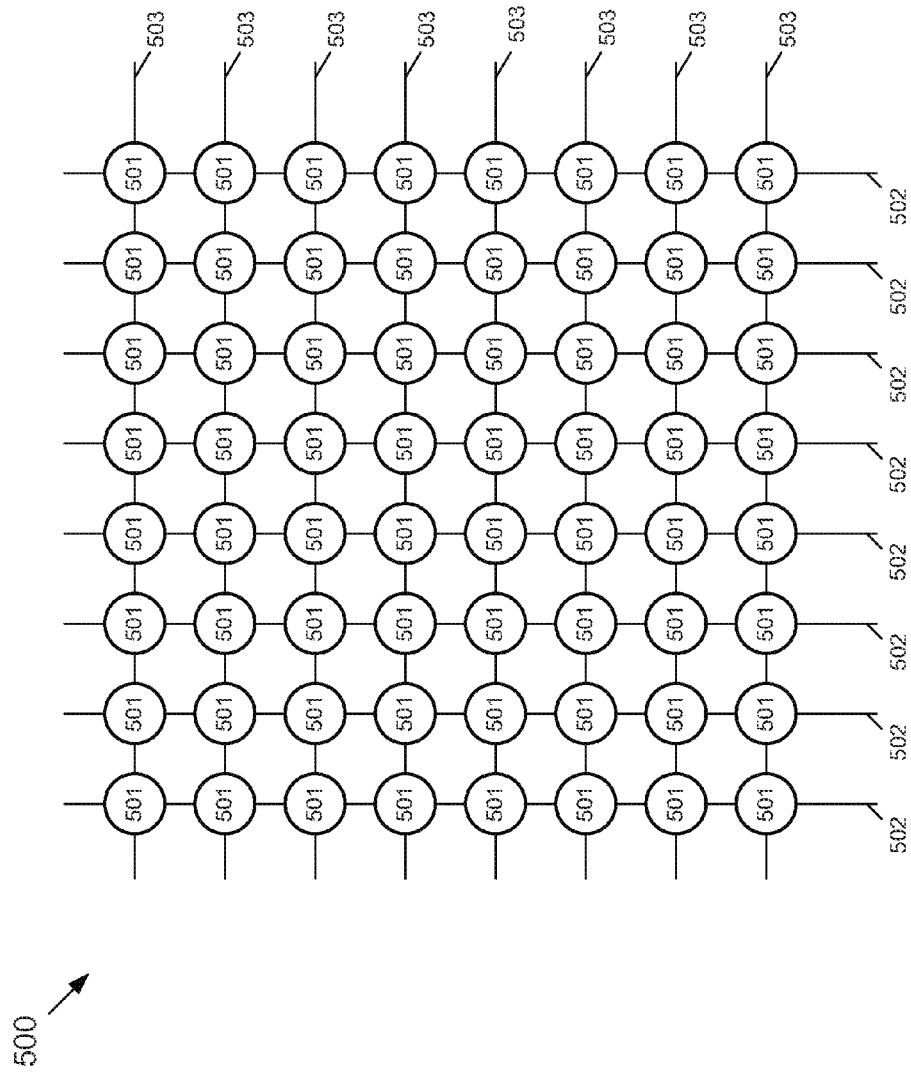
FIG. 5 depicts a schematic diagram of an exemplary embodiment of a memory array comprising NAND cells that can be programmed using any of the techniques according to the subject matter disclosed herein.

FIG. 5 depicts a schematic diagram of an exemplary embodiment of a memory array 500 comprising NAND cells that can be programmed using any of the techniques according to the subject matter disclosed herein. As depicted in FIG. 5, memory cells 501 are located at intersections of column signal lines 502 (e.g., bit lines) and row signal lines 503 (e.g., word lines). Individual column and/or row signal lines are electrically connected in a well-known manner to a memory controller (not shown) to selectively operate memory cells 501 in a well-known manner. It should be understood that memory array 500 can comprise part of a solid-state memory array or a solid-state drive that is coupled in a well-known manner to a computer system or an information-processing system (not shown).

Figure 6:
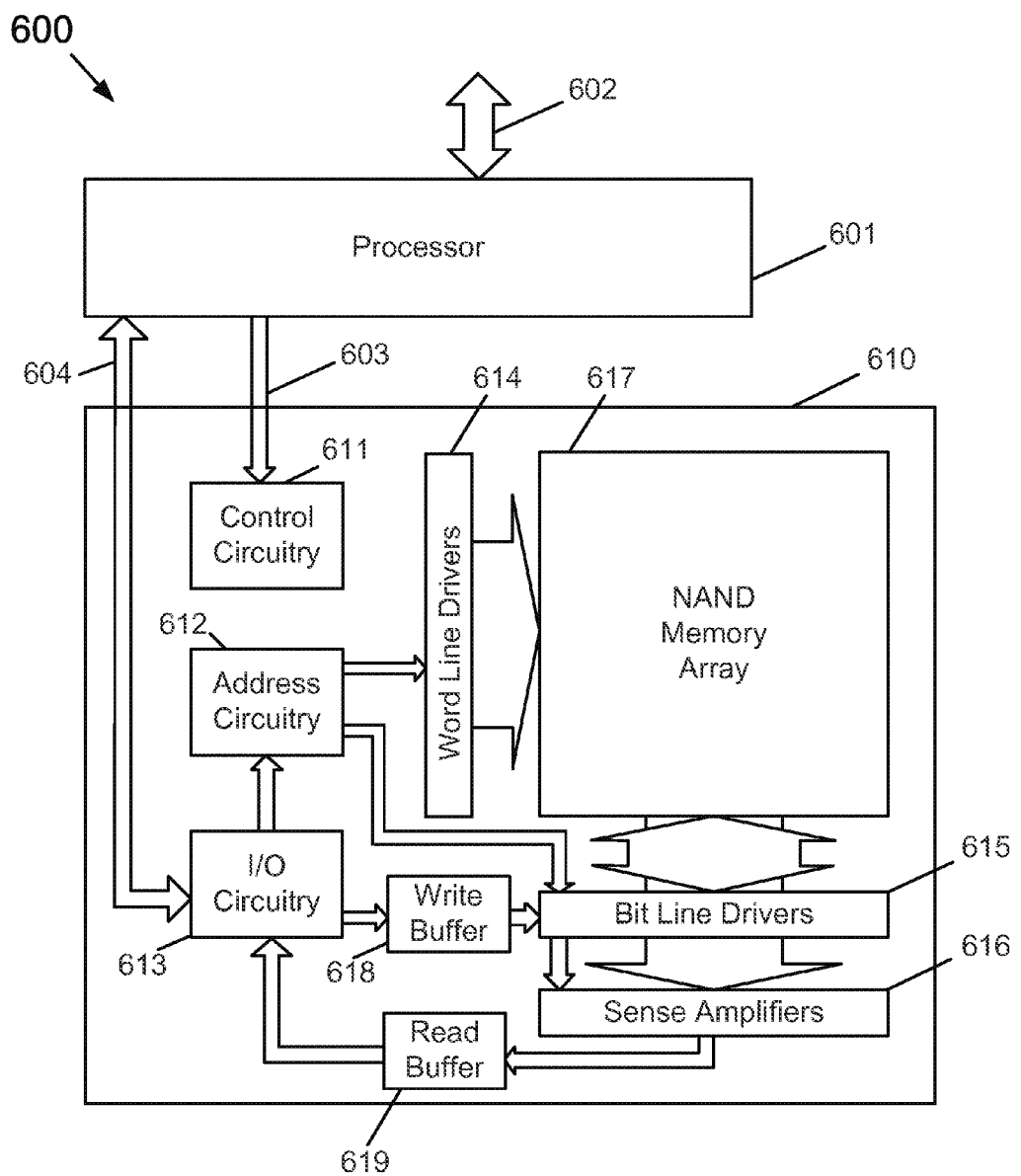
FIG. 6 depicts a functional block diagram of an exemplary embodiment of an electronic system comprising memory array according to the subject matter disclosed herein.

FIG. 6 depicts a functional block diagram of an exemplary embodiment of an electronic system 600 comprising memory array according to the subject matter disclosed herein. System 600 comprises a processor 601 that is coupled to a memory device 610 through control/address lines 603 and data lines 604. In some exemplary embodiments, data and control to may utilize the same physical lines. In some exemplary embodiments, processor 601 may be an external microprocessor, microcontroller, or some other type of external controlling circuitry. In other exemplary embodiments, processor 601 may be integrated in the same package or even on the same die as memory device 610. In some exemplary embodiments, processor 601 may be integrated with the control circuitry 611, thereby allowing some of the same circuitry to be used for both functions. Processor 601 may have external memory, such as random access memory (RAM) (not shown) and/or read only memory (ROM) (not shown), that is used for program storage and intermediate data. Alternatively, processor 601 may have internal RAM or ROM. In some exemplary embodiments, processor 601 may use memory device 610 for program or data storage. A program running on processor 601 may implement many different functions including, but not limited to, an operating system, a file system, defective chunk remapping, and error management.

In some exemplary embodiments, an external connection 602 is provided that allows processor 601 to communicate to external devices (not shown). Additional I/O circuitry (not shown) may be used to couple external connection 602 to processor 601. If electronic system 600 is a storage system, external connection 602 may be used to provide an external device with non-volatile storage. In one exemplary embodiment, electronic system 600 may be, but is not limited to, a solid-state drive (SSD), a USB thumb drive, a secure digital card (SD Card), or any other type of storage system. External connection 602 may be used to connect to a computer or other intelligent device, such as a cell phone or digital camera, using a standard or proprietary communication protocol. Exemplary computer communication protocols that may be compatible with external connection 602 include, but are not limited to, any version of the following protocols: Universal Serial Bus (USB), Serial Advanced Technology Attachment (SATA), Small Computer System Interconnect (SCSI), Fibre Channel, Parallel Advanced Technology Attachment (PATA), Integrated Drive Electronics (IDE), Ethernet, IEEE-1394, Secure Digital Card interface (SD Card), Compact Flash interface, Memory Stick interface, Peripheral Component Interconnect (PCI) or PCI Express.

If electronic system 600 is a computing system, such as a mobile telephone, a tablet, a notebook computer, a set-top box, or some other type of computing system, external connection 602 may be a network connection such as, but not limited to, any version of the following protocols: Institute of Electrical and Electronic Engineers (IEEE) 802.3, IEEE 802.11, Data Over Cable Service Interface Specification (DOCSIS), digital television standards such as Digital Video Broadcasting (DVB)—Terrestrial, DVB-Cable, and Advanced Television Committee Standard (ATSC), and mobile telephone communication protocols such as Global System for Mobile Communication (GSM), protocols based on code division multiple access (CDMA) such as CDMA2000, and Long Term Evolution (LTE).

Memory device 610 may include an array 617 of memory cells. Memory cell array 617 may be organized as a two dimensional or a three dimensional cross-point array and may be a phase-change memory (PCM), a phase-change memory with switch (PCMS), a resistive memory, nanowire memory, ferro-electric transistor random access memory (FeTRAM), a flash memory, magnetoresistive random access memory (MRAM) memory that incorporates memristor technology, a spin transfer torque (STT)-MRAM, or any other type of memory constructed as a cross-point array. In one exemplary embodiment, memory cell array 617 comprises a chalcogenide-based phase-change cross point memory array comprising tungsten and/or molybdenum carbide and/or boride interface layers according to the subject matter disclosed herein. Cross-point array 617 may be coupled to the word line drivers 614 and/or bit line drivers 615, and/or sense amplifiers 616 in a well-known manner Address lines and control lines 603 may be received and decoded by control circuitry 611, I/O circuitry 613 and address circuitry 612, which may provide control to the memory array 617. I/O circuitry 613 may couple to data lines 604 thereby allowing data to be received from and sent to processor 601. Data read from memory array 617 may be temporarily stored in read buffers 619. Data to be written to memory array 617 may be temporarily stored in write buffers 618 before being transferred to the memory array 617.

It should be understood that electronic system 600 depicted in FIG. 6 has been simplified to facilitate a basic understanding of the features of the system. Many different embodiments are possible including using a single processor 601 to control a plurality of memory devices 610 to provide for more storage space. Additional functions, such as a video graphics controller driving a display, and other devices for human-oriented I/O may be included in some exemplary embodiments.

These modifications can be made in light of the above detailed description. The terms used in the following claims should not be construed to limit the scope to the specific embodiments disclosed in the specification and the claims. Rather, the scope of the embodiments disclosed herein is to be determined by the following claims, which are to be construed in accordance with established doctrines of claim interpretation.

The invention claimed is:

1. A method to program a NAND device, the method comprising:
    applying a first programming pulse to gates of a plurality of NAND cells of a word line;
    determining a programmed threshold voltage ($V_t$) of each of the plurality of NAND cells in response to the first programming pulse;
    categorizing a NAND cell as a fast cell if the determined $V_t$ of the NAND cell is greater a first predetermined voltage, otherwise categorizing the NAND cell as a slow cell;

applying a second programming pulse to the gates of the slow-cell NAND cells if a slow cell NAND cell has a determined $V_t$ that is less than a program verify (PV) voltage;

applying a third programming pulse to the gates of the slow-cell and fast-cell NAND cells if a NAND cell has a determined $V_t$ that is less that the PV voltage, the third programming pulse having a programming voltage that is less than the programming voltage of the second programming pulse; and repeating the applying of the second and third programming pulses to the gates of the NAND cells until all of the NAND cells have a $V_t$ that is greater than the PV voltage.

2. The method according to claim 1, wherein the determining the programmed threshold voltage ($V_t$) of each of the plurality of NAND cells comprises applying a special verify pulse to the gates of each of the plurality of NAND cells.

3. The method according to claim 2, wherein a programming voltage of the second programming pulse is greater than the programming voltage of the third programming pulse by about a difference between the PV voltage and a voltage of the special verify pulse.

4. The method according to claim 3, wherein the PV voltage is about 1000 mV and the voltage of the special verify pulse is about −1000 mV.

5. The method according to claim 1, wherein categorizing a NAND cell as a fast cell if the determined $V_t$ of the NAND cell is greater a first predetermined voltage, otherwise categorizing the NAND cell as a slow cell further comprises categorizing the NAND cell as a fast cell if the determined $V_t$ of the NAND cell is greater or equal to a first predetermined voltage, otherwise categorizing the NAND cell as a slow cell.

6. The method according to claim 1, wherein the NAND device comprises part of a solid-state memory array or a solid-state drive.

7. A method to program a NAND device, the method comprising:

applying a first programming pulse to the gates of a plurality of NAND cells of a word line;

determining a programmed threshold voltage ($V_t$) of each of the plurality of NAND cells in response to the first programming pulse;

categorizing a NAND cell as a fast cell if the determined $V_t$ of the NAND cell is greater a first predetermined voltage;

categorizing a NAND cell as a middle cell if the determined $V_t$ of the NAND cell is less than the first predetermined voltage and greater than a second predetermined voltage;

categorizing a NAND cell as a slow cell if the determined $V_t$ of the NAND cell is less than the second predetermined voltage;

applying a second programming pulse to the gates of the slow-cell NAND cells if a slow cell NAND cell has a determined $V_t$ that is less than a program verify (PV) voltage;

applying a third programming pulse to the gates of a slow-cell and middle-cell NAND cells if a slow cell NAND cell has a determined $V_t$ that is less than a program verify (PV) voltage, the third programming pulse having a programming voltage that is less than the programming voltage of the second programming pulse;

applying a fourth programming pulse to the gates of the slow-cell, middle cell and fast-cell NAND cells if a NAND cell has a determined $V_t$ that is less that the PV voltage, the fourth programming pulse having a programming voltage that is less than the programming voltage of the third programming pulse; and repeating the applying of the second, third and fourth programming pulses to the gates of the NAND cells until all of the NAND cells have a $V_t$ that is greater than the PV voltage.

8. The method according to claim 7, wherein determining the programmed threshold voltage ($V_t$) of each of the plurality of NAND cells comprises applying a special verify pulse to the gates of each of the plurality of NAND cells.

9. The method according to claim 7, wherein a programming voltage of the second programming pulse is greater than the programming voltage of the third programming pulse by about a difference between a different between PV voltage and the second predetermined voltage and a different between PV voltage and the first predetermined voltage, and wherein a programming voltage of the third programming pulse is greater than the programming voltage of the fourth programming pulse by about a different between PV voltage and the first predetermined voltage.

10. The method according to claim 7, wherein the NAND device comprises part of a solid-state memory array or a solid-state drive.

11. A solid-state memory device, comprising:

an array of a plurality of NAND cells, the array comprising at least one word line coupled to a first plurality of NAND cells of the array;

a read/write circuitry coupled to the array; and a controller coupled to the read/write circuitry, the controller to control the read/write circuitry to apply a first programming pulse to gates of a plurality of NAND cells of the at least one word line, to determine a programmed threshold voltage ($V_t$) of each of the plurality of NAND cells in response to the first programming pulse, categorize a NAND cell as a fast cell if the determined $V_t$ of the NAND cell is greater a first predetermined voltage, otherwise to categorize the NAND cell as a slow cell, to apply a second programming pulse to the gates of the slow-cell NAND cells if a slow cell NAND cell has a determined $V_t$ that is less than a program verify (PV) voltage, to apply a third programming pulse to the gates of the slow-cell and fast-cell NAND cells if a NAND cell has a determined $V_t$ that is less that the PV voltage, the third programming pulse having a programming voltage that is less than the programming voltage of the second programming pulse, and to repeat the applying of the second and third programming pulses to the gates of the NAND cells until all of the NAND cells have a $V_t$ that is greater than the PV voltage.

12. The solid-state memory device according to claim 11, wherein the controller is to further determine the programmed threshold voltage ($V_t$) of each of the plurality of NAND cells by applying a special verify pulse to the gates of each of the plurality of NAND cells.

13. The solid-state memory device according to claim 12, wherein a programming voltage of the second programming pulse is greater than the programming voltage of the third programming pulse by about a difference between the PF voltage and a voltage of the special verify pulse.

14. The solid-state memory device according to claim 13, wherein the PV voltage is about 1000 mV and the voltage of the special verify pulse is about −1000 mV.

15. The solid-state memory device according to claim 11, wherein the controller is to further categorize the NAND cell as a fast cell if the determined $V_t$ of the NAND cell is greater or equal to a first predetermined voltage, otherwise categorizing the NAND cell as a slow cell.

16. An electronic system, comprising:
a processor; and
a memory device coupled to the processor, the memory device comprising:
an array of a plurality of NAND cells, the array comprising at least one word line coupled to a first plurality of NAND cells of the array;
a read/write circuitry coupled to the array; and
a controller coupled to the read/write circuitry, the controller to control the read/write circuitry to apply a first programming pulse to gates of a plurality of NAND cells of the at least one word line, to determine a programmed threshold voltage ($V_t$) of each of the plurality of NAND cells in response to the first programming pulse, categorize a NAND cell as a fast cell if the determined $V_t$ of the NAND cell is greater a first predetermined voltage, otherwise to categorize the NAND cell as a slow cell, to apply a second programming pulse to the gates of the slow-cell NAND cells if a slow cell NAND cell has a determined $V_t$ that is less than a program verify (PV) voltage, to apply a third programming pulse to the gates of the slow-cell and fast-cell NAND cells if a NAND cell has a determined $V_t$ that is less that the PV voltage, the third programming pulse having a programming voltage that is less than the programming voltage of the second programming pulse, and to repeat the applying of the second and third programming pulses to the gates of the NAND cells until all of the NAND cells have a $V_t$ that is greater than the PV voltage.

17. The electronic system according to claim 16, wherein the controller is further to determine the programmed threshold voltage ($V_t$) of each of the plurality of NAND cells by applying a special verify pulse to the gates of each of the plurality of NAND cells.

18. The electronic system according to claim 17, wherein a programming voltage of the second programming pulse is greater than the programming voltage of the third programming pulse by about a difference between the PF voltage and a voltage of the special verify pulse.

19. The electronic system according to claim 18, wherein the PV voltage is about 1000 mV and the voltage of the special verify pulse is about −1000 mV.

20. The electronic system according to claim 16, wherein the controller is to further categorize the NAND cell as a fast cell if the determined $V_t$ of the NAND cell is greater or equal to a first predetermined voltage, otherwise categorizing the NAND cell as a slow cell.

21. The electronic system according to claim 16, wherein the array comprises part of a solid-state memory array or a solid-state drive.

* * * * *